(12) United States Patent
Aotsuka

(10) Patent No.: US 7,515,196 B2
(45) Date of Patent: Apr. 7, 2009

(54) COLOR SOLID-STATE IMAGING DEVICE, SOLID-STATE IMAGING APPARATUS USING THE COLOR SOLID-STATE IMAGING DEVICE, AND DIGITAL CAMERA

(75) Inventor: Yasuo Aotsuka, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 710 days.

(21) Appl. No.: 10/951,689

(22) Filed: Sep. 29, 2004

(65) Prior Publication Data
US 2005/0068433 A1 Mar. 31, 2005

(30) Foreign Application Priority Data
Sep. 30, 2003 (JP) ............... P.2003-341448

(51) Int. Cl.
H04N 5/225 (2006.01)
H04N 3/14 (2006.01)
H04N 9/07 (2006.01)
(52) U.S. Cl. ............... 348/342; 348/272; 348/336
(58) Field of Classification Search ............... 348/272, 348/360, 322, 342, 273
See application file for complete search history.

(56) References Cited

U.S. PATENT DOCUMENTS

| | | | | |
|---|---|---|---|---|
| 5,245,449 A | * | 9/1993 | Ooi et al. | 349/10 |
| 5,541,673 A | * | 7/1996 | Shioya et al. | 348/752 |
| 6,203,951 B1 | * | 3/2001 | Furukawa et al. | 430/7 |
| 6,943,335 B2 | * | 9/2005 | Hashimoto | 250/208.1 |
| 7,006,141 B1 | * | 2/2006 | Neil et al. | 348/360 |
| 7,038,722 B2 | * | 5/2006 | Kitagishi | 348/272 |
| 2002/0186310 A1 | * | 12/2002 | Kitagishi | 348/272 |
| 2003/0220741 A1 | * | 11/2003 | Hashimoto | 702/4 |
| 2004/0085448 A1 | * | 5/2004 | Goto et al. | 348/148 |
| 2005/0180010 A1 | * | 8/2005 | Mukaiyama et al. | 359/497 |
| 2006/0132641 A1 | * | 6/2006 | Hayakawa | 348/342 |

FOREIGN PATENT DOCUMENTS

JP 11-352324 A 12/1999

* cited by examiner

Primary Examiner—Tuan V Ho
Assistant Examiner—Marly Camargo
(74) Attorney, Agent, or Firm—Birch, Stewart, Kolasch & Birch LLP

(57) ABSTRACT

A color solid-state imaging device used in combination with an interference-type infrared cut filter, the element comprises a coloring material which is contained in or formed on any of layers provided within an incident light path in the color solid-state imaging device, wherein the coloring material absorbs an incident light within a wavelength range in which a cut wavelength of the interference-type infrared cut filter shifts toward shorter wavelengths when the incident light obliquely enters the interference-type infrared cut filter.

10 Claims, 14 Drawing Sheets

COLOR SOLID-STATE IMAGING DEVICE, SOLID-STATE IMAGING APPARATUS USING THE COLOR SOLID-STATE IMAGING DEVICE, AND DIGITAL CAMERA

This Nonprovisional application claims priority under 35 U.S.C. § 119(a) on Patent Application No(s). 2003-341448 filed in Japan on Sep. 30, 2003, the entire contents of which are hereby incorporated by reference.

BACKGROUND OF THE INVENTION

1. Field of the Invention

The present invention relates to a solid-state imaging device having a color filter, a solid-state imaging apparatus using in combination the solid-state imaging device and an interference-type infrared cut filter, and a digital camera.

2. Description of the Related Art

A digital camera, such as a digital still camera or a digital video camera, is equipped with a solid-state imaging device, such as a CCD or MOS, and converts an optical image entering the camera by way of a lens into an electric signal by means of the solid-state imaging device. A plurality of photoelectric conversion elements (e.g., photodiodes; the elements will hereinafter be described as "pixels") are formed in an array pattern on the surface of the color solid-state imaging device. Any color filter of an R filter, a G filter, and a B filter is formed on each pixel in the case of a primary-color-based color solid state imaging device.

FIG. 13 is a graph showing spectral sensitivity of the foregoing color solid-state imaging device. A pixel on which the R filter is formed (hereinafter also referred to as an "R pixel") outputs an electric signal corresponding to the quantity of light of a red component having passed through the R filter. Likewise, a pixel on which the G filter is formed outputs an electric signal corresponding to the quantity of light of a green component of the incident light having passed through the G filter. A pixel on which the B filter is formed outputs an electric signal corresponding to the quantity of light of a blue component of the incident light having passed through the B filter.

However, pigment or dye which can be used for the R filter fails to perform idealistic absorption of infrared radiation. For this reason, a signal output from the R pixel includes a signal corresponding to a large quantity of incoming infrared radiation.

An infrared cut filter has hitherto been inserted in front of the color-solid-state imaging device, thereby blocking the infrared radiation, which cannot be blocked by the R filter.

The infrared cut filter is roughly classified into two types of filters. Namely, one type of filter is a color glass filter, and the other type of filter is an interference-type infrared cut filter utilizing a reflection film. FIG. 14 is a graph showing spectral transmission factors of respective infrared cut filters. A graph of a spectral transmission factor of each glass filter is represented by a characteristic line I, and the spectral transmittance factor of the interference-type infrared cut filter is represented by a characteristic line II.

As can be seen from FIG. 14, the color glass filter absorbs red light in a visible range. The interference-type infrared cut filter has a characteristic of sharply cutting infrared radiation whose wavelength is higher than a cut wavelength (represented by a wavelength at which transmittance becomes 50%).

FIG. 15 is a graph showing spectral sensitivity achieved while the infrared cut filter is placed in front of the color solid-state imaging device. It is understood that the spectral sensitivity—which is indicated by a solid line and uses an interference-type infrared cut filter—shows a sharp decrease in the vicinity of the cut wavelength [this example uses an interference-type infrared cut filter (labeled IR655) manufactured such that the cut wavelength appears at 655 nm] and that little decrease arises in the spectral sensitivity at wavelengths which are shorter than the cut wavelength.

In contrast, dotted lines show spectral sensitivity achieved through use of the color glass filter, and it is understood that a decrease in the sensitivity of a red color (R) is great. Further, a decrease has also arisen in the sensitivity of green color (G). When the sensitivity of R, that of G, and that of B, which are achieved through use of the interference-type infrared cut filter, are presumed to be 100, the sensitivity of R, that of, G, and that of B, which are achieved through use of the color glass filter, particularly show a decrease in red color, as shown in Table 1 provided below.

TABLE 1

| COMPARISON OF CAMERA SENSITIVITIES (sensitivity achieved through use of IR655 is taken as 100) | | | |
|---|---|---|---|
| CCD/IR CUT FILTER | RED | GREEN | BLUE |
| CCD (FIG. 13)/IR655 | 100 | 100 | 100 |
| CCD (FIG. 13)/ GLASS FILTER | 58 | 91 | 98 |

For this reason, the interference-type infrared cut filter involving a small decrease in sensitivity is frequently used as an infrared cut filter to be used in combination with the color solid-state imaging device.

However, the interference-type infrared cut filter has a problem of occurrence of a change in a spectral characteristic of a light ray when the light ray has obliquely entered the interference-type infrared cut filter. Specifically, the problem is that, as incident light enters obliquely, the cut wavelength shifts toward shorter wavelengths. A characteristic line II shown in FIG. 14 shows a case where incident light has entered the surface of a plate-like interference-type infrared cut filter at right angles (i.e., at an incident angle of 0°). A characteristic line II' shows a characteristic achieved when the incident angle of the incident light assumes an angle of 13°. The cut wavelength of the characteristic line II' has shifted toward the shorter wavelengths by about 5 nm as compared with the cut wavelength of the characteristic line II.

Miniaturization and slimming down of a recent digital still camera have been pursued, and the digital still camera is built in a portable cellular phone. For reasons of such progress in miniaturization of the digital still camera, a short focus lens is used in front of a color solid-state imaging device equipped with the interference-type infrared cut filter. Therefore, the incident light having passed through the lens assumes an incident angle of 0° (i.e., enters perpendicularly) at the center of the solid-state imaging device. However, the incident light enters obliquely in the periphery of the solid-state imaging device. A greatly-miniaturized digital camera assumes an incident angle of about 13°. However, when miniaturization of the digital camera is pursued, the incident angle becomes 13° or more.

As can be seen from the characteristic line II' shown in FIG. 14, the shift in cut wavelength, which is induced as a result of oblique entrance of incident light into the interference-type infrared cut filter, does not extend to a green range or a blue range. Therefore, a decrease in the sensitivity of green color or a decrease in the sensitivity of blue color is not induced. However, a shift in cut wavelength causes a decrease in the sensitivity of red color. Specifically, a decrease arises in the sensitivity of red color with increasing proximity to the periphery of the solid-state imaging device, thereby causing inconsistencies in color (color shading). For instance, when an image which is totally gray is photographed, a deficiency in red arises at the edge of the image, and hence the edge of the image assumes a cyan-toned color.

Therefore, according to the related-art technique described in, e.g., JP-A-11-352324, the interference-type infrared cut filter to be disposed in front of the solid-state imaging device is formed not in a plate-like shape but a curved shape, thereby rendering smaller the incident angle of incoming light at the periphery of the solid-state imaging device.

The interference-type infrared cut filter is formed into a curved shape, thereby preventing the incident angle of light entering the solid-state imaging device from becoming greater around the periphery of the solid-state imaging device. As a result, color fading, which is responsible for a shift in cut wavelength of the interference-type infrared cut filter, can be diminished.

However, when the interference-type infrared cut filter is formed into a curved shape, the thickness of the interference-type infrared cut filter is increased, which in turn hinders miniaturization and slimming down of the digital camera and adds to costs incurred in manufacturing the interference-type infrared cut filter.

SUMMARY OF THE INVENTION

An object of the present invention is to provide a color solid-state imaging device which enables lessening of color shading attributable to oblique incident light when used in combination with an interference-type infrared cut filter, a solid-state imaging apparatus using the color solid-state imaging device, and a digital camera.

A color solid-state imaging device of the present invention is a color solid-state imaging device used in combination with an interference-type infrared cut filter, the element comprising a coloring material which is contained in or formed on any of layers provided within an incident light path in the color solid-state imaging device, wherein the coloring material absorbs an incident light within a wavelength range in which a cut wavelength of the interference-type infrared cut filter shifts toward shorter wavelengths when the incident light obliquely enters the interference-type infrared cut filter.

By means of this configuration, even when the cut wavelength of the interference-type infrared cut filter has shifted around a periphery of the color solid-state imaging device, the red spectral sensitivity has originally been reduced by the coloring material. Hence, a deficiency in red color does not become noticeable in the periphery of the color solid-state imaging device.

According to the present invention, there is provided a color solid-state imaging device further comprising at least one set of effective pixels, wherein said at least one set of effective pixels comprise a first set of effective pixels, each of which being equipped with a color filter that filters a red color; wherein the incident light path comprises at least one set, one of which comprising a first subset of light paths corresponding to the first set of effective pixels; and wherein the coloring material is contained in or formed on any of layers provided within each path of the first subset of light paths.

By means of this configuration, influence of the coloring material on another pixel can be inhibited.

According to the present invention, there is provided a color solid-state imaging device, further comprising a plurality of effective pixels, wherein the incident light path comprises a plurality of light paths, each of which corresponding to each of said plurality of effective pixels; and wherein the coloring material is contained in or formed on any of layers provided within each of said plurality of light paths.

This configuration facilitates a process for causing a layer to contain a coloring material.

According to the present invention, there is provided a color solid-state imaging device, further comprising at least one of a color filter, a planarizing layer and a microlens, each of which being provided within the incident light path, wherein the coloring material is contained in at least one of the color filter, the planarizing layer and the microlens.

By means of this configuration, the coloring material can be contained in the color filter during a process for forming a color filter, the planarized layer during a process for forming a planarized layer, and a microlens during a process for forming a microlens.

According to the present invention, there is provided a color solid-state imaging device, wherein a sensitivity of the cut wavelength is made half or less a peak of spectral sensitivity of a red color by the contained coloring material.

By means of this configuration, a deficiency in red color at the periphery of the color solid-state imaging device can be made much smaller as compared with a red color at the center of the same. Preferably, the red sensitivity of the cut wavelength is made much smaller than half (0.5) a peak of read spectral sensitivity; namely, 0.4 or less, more preferably, 0.3 or less.

According to the present invention, there is provided a color solid-state imaging device, wherein the cut wavelength of the interference-type infrared cut filter ranges from 670 nm to 690 nm.

By means of this configuration, a deficiency in red color at the periphery of the color solid-state imaging device can be made much smaller as compared with a red color at the center of the same.

According to the present invention, there is provided a solid-state imaging apparatus comprising: an interference-type infrared cut filter; and a color solid-state imaging device, wherein the interference-type infrared cut filter has a cut wavelength of 670 nm or more.

By means of this configuration, a lower end portion of red spectral sensitivity is cut by means of the interference-type infrared cut filter. As a result, even when the cut wavelength has shifted, a deficiency in red color at the periphery of the color solid-state imaging device can be made much smaller as compared with a red color at the center of the same.

According to the present invention, there is provided a solid-state imaging apparatus wherein the color solid-state imaging device is a color solid-state imaging device as set fort in any of the above.

By means of this configuration, the lower end portion of the red spectral sensitivity to be cut by the interference-type infrared cut filter becomes much lower, whereby a red color at the periphery of the color solid-state imaging device becomes much smaller as compared with a deficiency in red color at the center of the same.

According to the present invention, there is provided a solid-state imaging apparatus comprising: an interference-type infrared cut filter; a color solid-state imaging device; and a red color absorbing coloring material provided in an incident light path in the solid-state imaging apparatus such that, when a peak of a red spectral sensitivity of the color solid-state imaging device is taken as 100, (i) a first wavelength, which is shorter than a cut wavelength of the interference-type infrared cut filter by 20 nm, is longer than the wavelength of the peak sensitivity of the red spectral sensitivity and (ii) a first red spectral sensitivity at the first wavelength assumes a value of 80 or less.

By means of this configuration, even when the cut wavelength of the interference-type infrared cut filter has shifted in the periphery of the color solid-state imaging device, the original red spectral sensitivity in the vicinity of the cut wavelength has been made lower by means of the coloring material. Hence, a deficiency in red color at the periphery of the color solid-state imagine element becomes less noticeable.

According to the present invention, there is provided a solid-state imaging apparatus, wherein the color solid-state imaging device and the interference-type infrared cut filter are formed integrally.

This configuration facilitates handling of the solid-state imaging apparatus.

According to the present invention, there is provided a digital camera comprising: a photographing lens; a solid-state imaging apparatus as set forth in any of the above; and a control section that processes photographed image data output from the solid-state imaging apparatus and stores the photographed image data into a recording medium.

This configuration makes color shading arising in the periphery of an image of the subject smaller and less noticeable.

According to the present invention, there is provided a digital camera comprising: a photographing lens; an interference-type infrared cut filter that cuts infrared radiation in light entering by way of the photographing lens; a color solid-state imaging device that converts, into an electric signal, an optical image entering by way of the interference-type infrared cut filter; and a control section that processes a signal output from the color solid-state imaging device and stores image data into a recording medium, wherein a film containing a coloring material is formed on at least one of a surface of the photographing lens, a surface of an optical low-pass filter and a surface of the interference-type infrared cut filter; and wherein the coloring material absorbs an incident light within a wavelength range in which a cut wavelength of the interference-type infrared cut filter shifts toward shorter wavelengths when the incident light obliquely enters the interference-type infrared cut filter.

This configuration makes color shading arising in the periphery of an image of the subject smaller and less noticeable, and facilitates formation of a coloring material film.

DETAILED DESCRIPTION OF THE INVENTION

An embodiment of the invention will be described hereinbelow by reference to the drawings.

Figure 1:
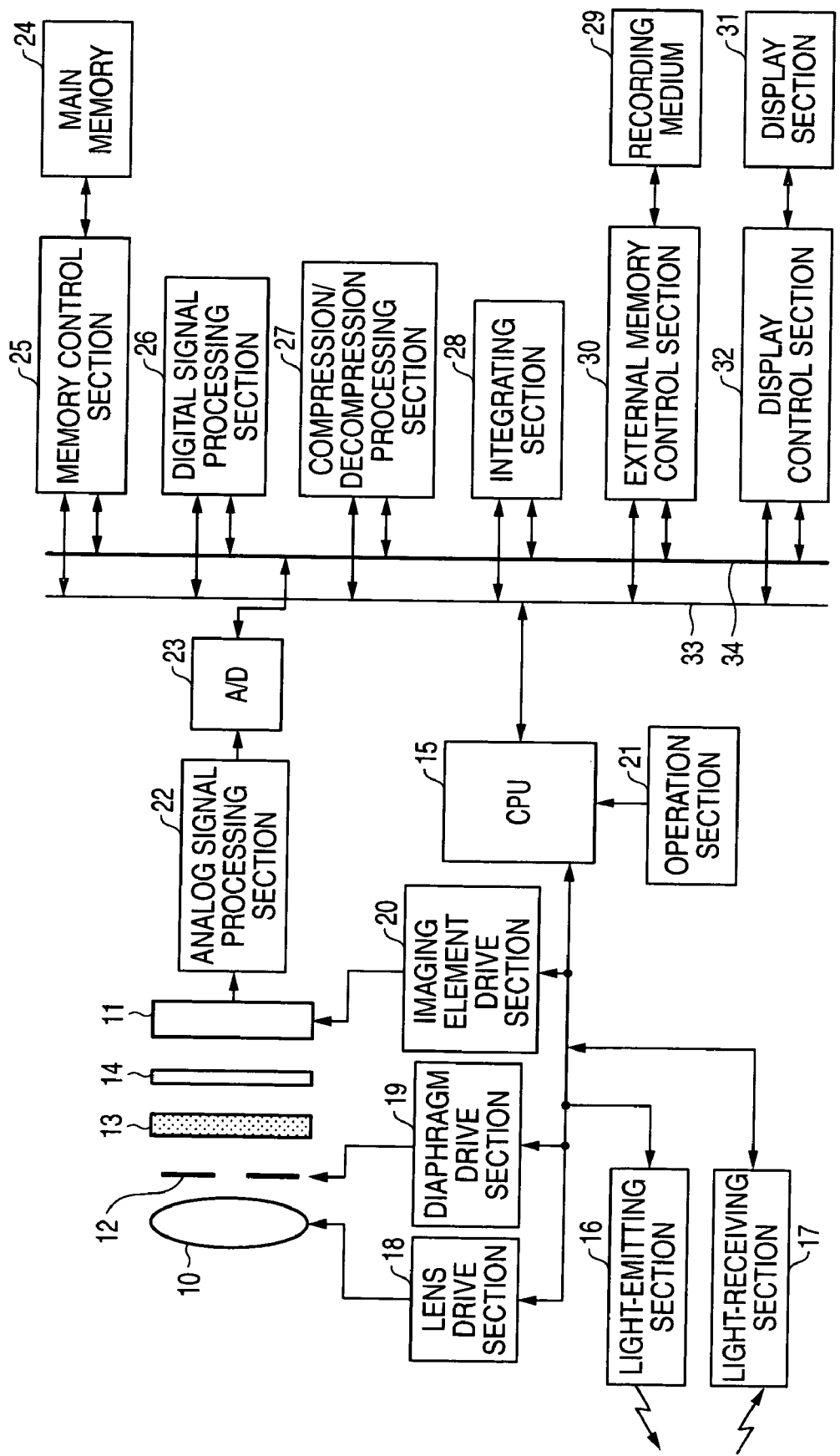
FIG. 1 is a block diagram of a digital still camera according to an embodiment of the present invention.

FIG. 1 is a block diagram of a digital still camera according to an embodiment of the present invention. In this embodiment, a digital still camera is taken as an example. However, the present invention can be applied to another type of digital camera, such as a digital video camera or a portable cellular phone equipped with a camera.

The digital still camera shown in FIG. 1 comprises a photographing lens 10; a color solid-state imaging device 11; a diaphragm 12 provided therebetween; a flat-shaped interference-type infrared cut filter 13; and an optical low-pass filter 14. A CPU 15 (i.e., control section) for controlling the entirety of the digital still camera controls a light-emitting section 16 for flash light purpose and a light-receiving section 17. Further, the CPU 15 controls a lens drive section 18, to thereby adjust the position of the photographing lens 10 to a focus position. The CPU 15 controls the size of an opening of the diaphragm 12 by way of a diaphragm drive section 19, thereby controlling the amount of light exposure to an optimum exposure.

The CPU 15 drives the solid-state imaging device 11 by way of an imaging device drive section 20, thereby outputting an image of the subject photographed by way of the photographing lens 10 as a color signal. A user command signal is input to the CPU 15 by way of an operation section 21. The CPU 15 performs various control operations in accordance with the command.

An electrical control system of the digital still camera comprises an analog signal processing section 22 connected to an output of the solid-state imaging device 11; and an analog-to-digital conversion circuit 23 for converting into a digital signal RGB color signals output from the analog signal processing section 22. The electrical control system is controlled by the CPU 15.

An electrical control system of the digital still camera comprises a memory control section 25 connected to main memory 24; a digital signal processing section 26 for performing white balance correction operation, gamma correction operation, synchronizing operation, or the like; a compression/decompression processing section 27 for compressing a photographed image into a JPEG image and decompressing a compressed data; an integrating section 28 which integrates the image data which have been output from the solid-state imaging device 11 and converted into digital data for respective R, G, and B colors and outputs integrated values to the digital signal processing section 26 for white balance correction purpose; an external memory control section 30 to which a removable recording medium 29 is connected; and a display control section 32 to which a liquid-crystal display section 31 provided on the back of the camera is connected. These elements are interconnected by means of a control bus 33 and a data bus 34 and controlled by a command output from the CPU 15.

The order in which the interference-type infrared cut filter 13 and the optical low-pass filter 14 are arranged may be reversed, or the interference-type infrared cut filter 13 may be formed integrally on the surface of the solid-state imaging device 11.

Figure 2:
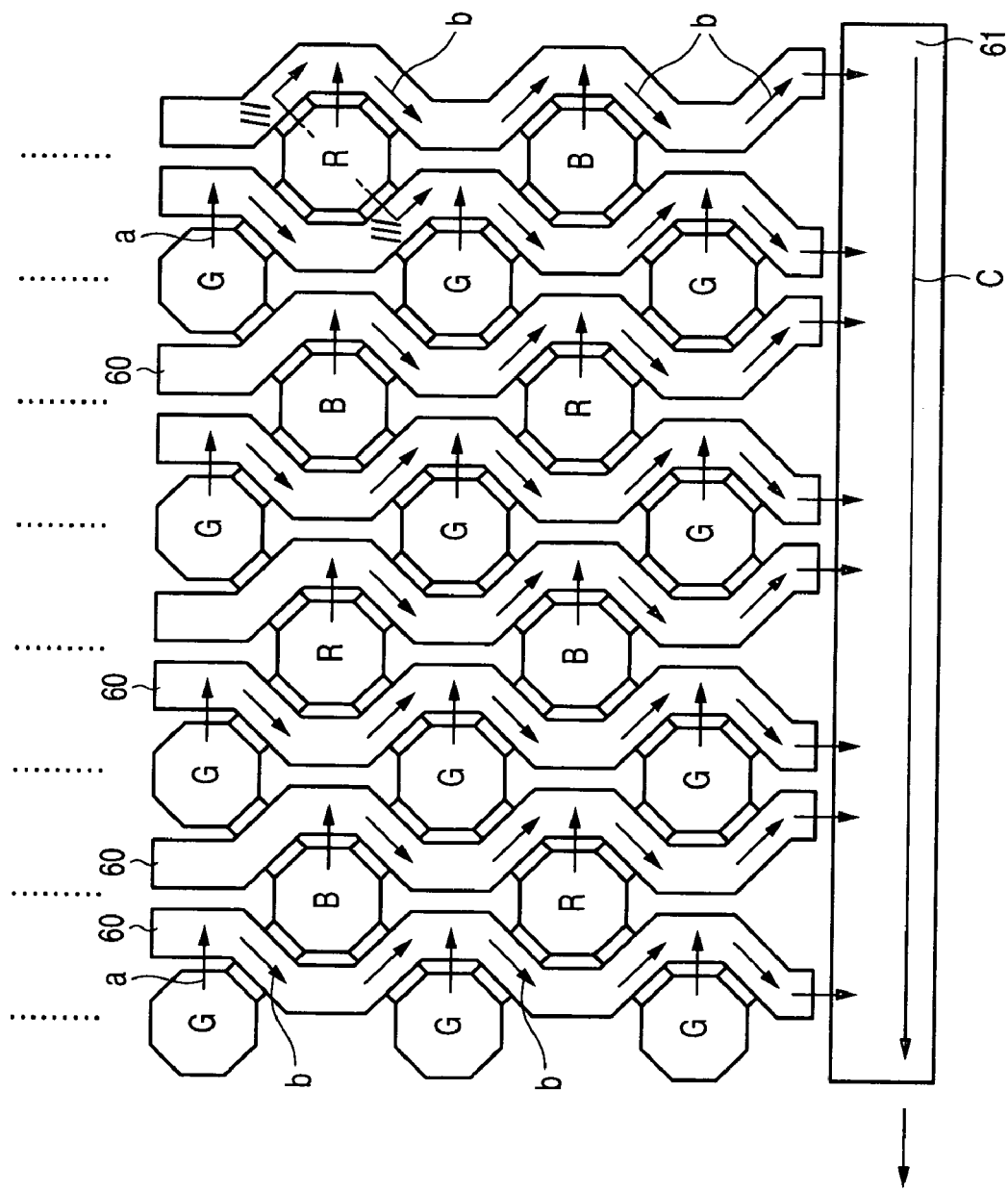
FIG. 2 is a surface diagram of a solid-state imaging device shown in FIG. 1.

FIG. 2 is a surface diagram of a color solid-state imaging device employed in the present embodiment. In the present embodiment, a single-plate color CCD in which pixels are arranged in a honeycomb pattern is used as the solid-state imaging device 11. The CCD has a structure in which a plurality of photodiodes having green (G) filters are arranged at given intervals longitudinally and laterally. Photodiodes having blue (B) and red (R) color filters are alternately arranged at positions which are offset, by one-half pitch, from the photodiodes arranged in rows and columns. In the illustrated embodiment, octagonal frames affixed with "R", "G", and "B" show red, green, and blue color filters, respectively. Corresponding photodiodes are provided at positions below the color filters (i.e., a low position in the paper). More precisely, the octagonal frames show the shapes of the photodiodes, and the red, green, and blue color filters are provided in size larger than the octagonal frames (i.e., an octagonal or square shape)

Signal electric charges stored in the respective photodiodes as a result of entrance of light by way of the respective color filters are read to vertical transfer channels 60 formed beside the respective photodiodes, as indicated by a narrow "a". The signal electric charges are transferred along the vertical transfer channels 60 as indicated by an arrow "b" and reach a horizontal transfer channel 61. At this point, the electric charges are transferred along the horizontal transfer channel 61, as indicated by an arrow "c". The electric charges are then read from the solid-state imaging device 11. The amounts of signal electric charges read from the respective pixels (photodiodes) correspond to the amount of light received by the respective photodiodes.

Figure 3:
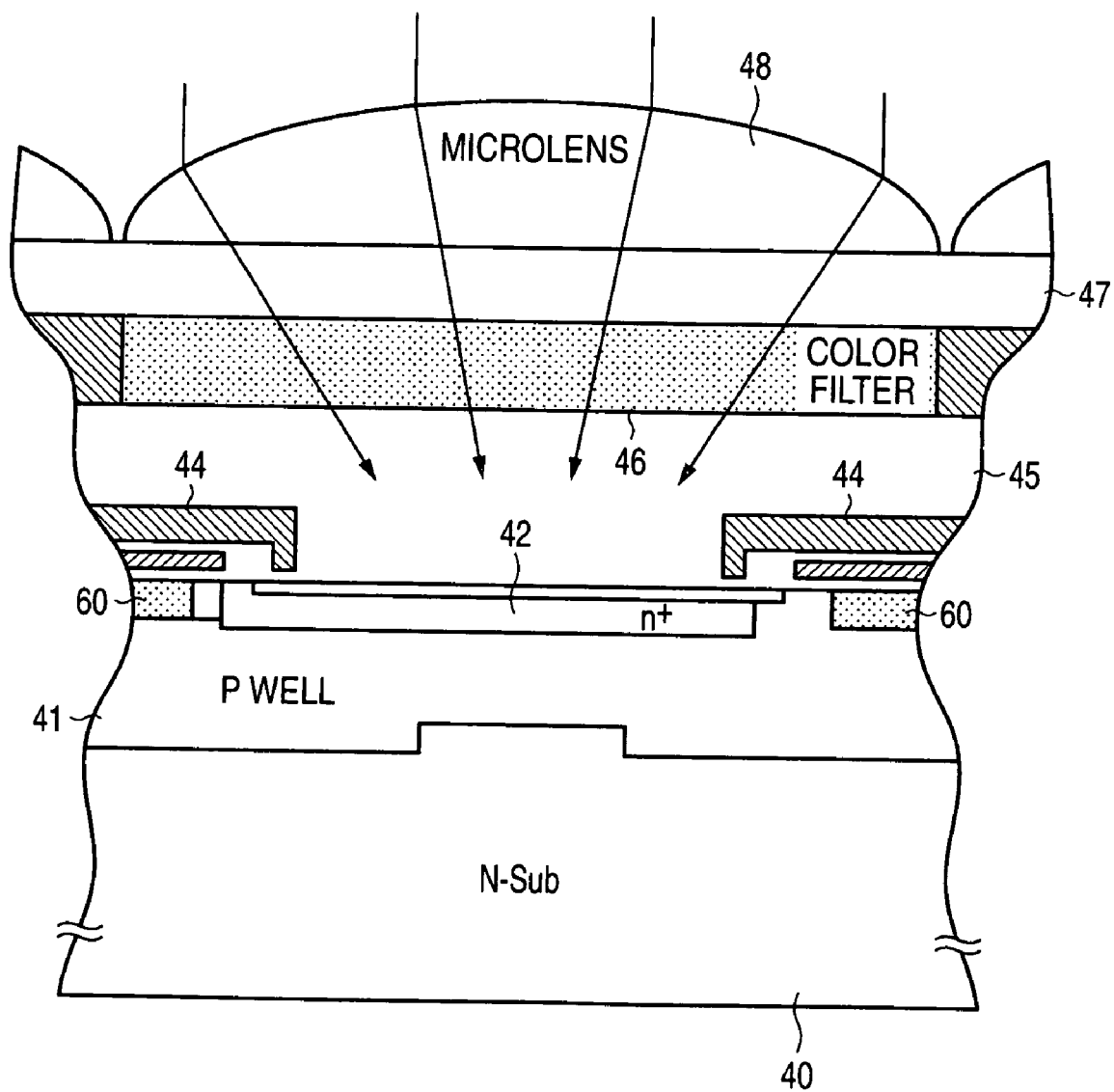
FIG. 3 is a cross-sectional surface diagram taken along line III-III shown in FIG. 2.

FIG. 3 is a cross-sectional surface diagram taken along line III-III shown in FIG. 2. Specifically, in this embodiment, FIG. 3 is a longitudinally-cross-sectional diagram of an R pixel having an R filter stacked thereon. The G pixel and B pixel are identical in basic configuration with the R pixel, and they differ from each other in terms of only the colors of the color filters (CF). A P-well layer 41 is formed on the surface of an n-type semiconductor substrate 40, and an n$^+$ layer 42 is formed on the surface of the P well layer 41. A photodiode (pixel) is formed from a P-N junction consisting of the P well layer 41 and the n$^+$ layer 42.

The vertical transfer channels 60 are formed beside the respective photodiodes, and a light-shielding film 44 is provided on the vertical transfer channels 60. Light enters the respective photodiodes by way of openings of the light-shielding film 44. A planarized layer 45 is formed on the light-shielding film 44, and the color filter (an R filter in the embodiment shown in FIG. 3) 46 is stacked on the planarized layer 45. A microlens (top lens) 48 is further provided on the color filter 46 by way of a planarized layer 47. An interlayer lens (microlens) may sometimes be inserted to a predetermined location between the top lens 48 and the n+ layer 42.

As mentioned above, any of the R, G, B color filters are superimposed on the surfaces of the respective photodiodes of the solid-state imaging device 11. The color filters are manufactured through use of, e.g., pigment or dye.

Figure 4:
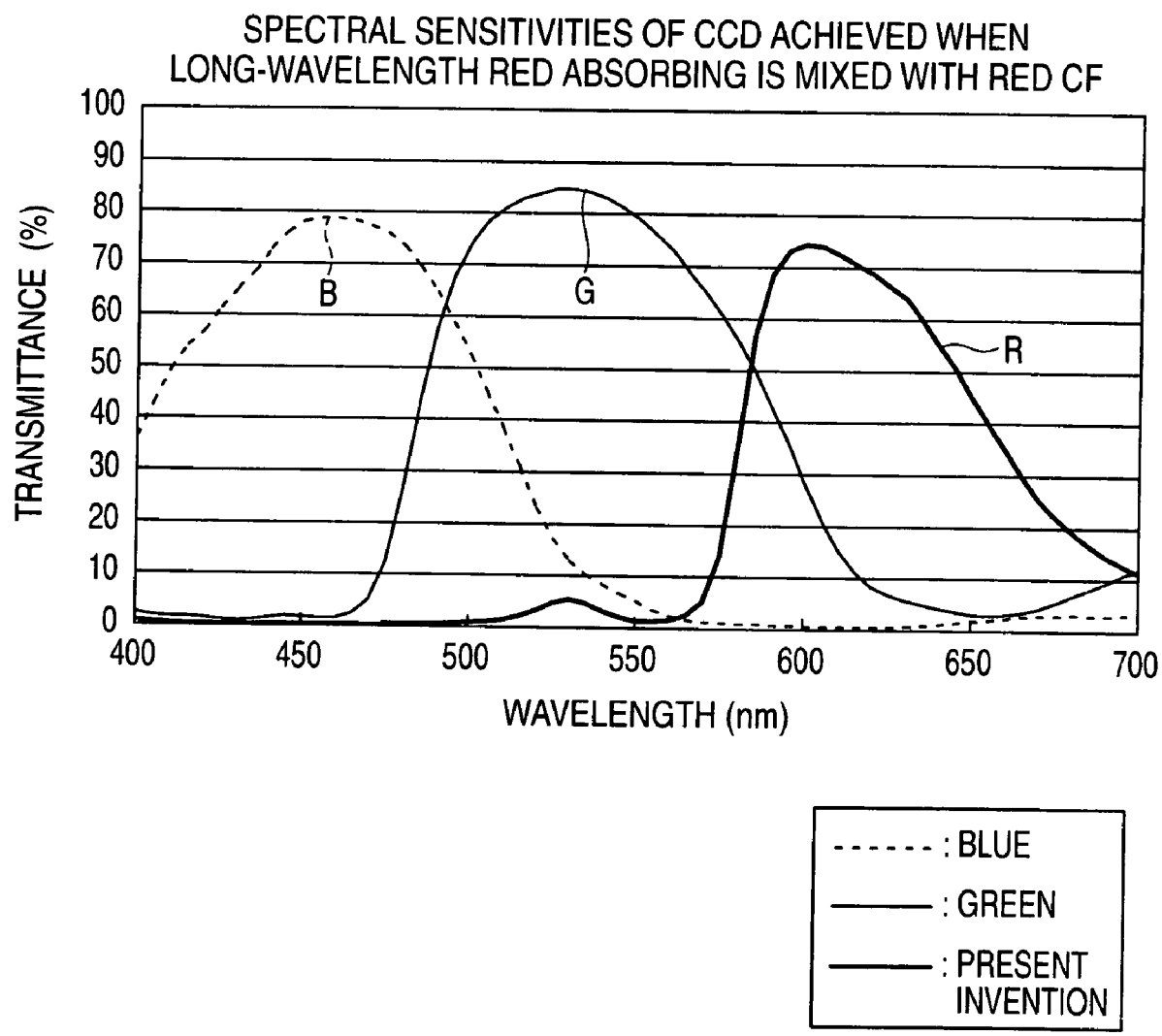
FIG. 4 is a graph showing R, G, B spectral sensitivities of the solid-state imaging device according to the embodiment of the present invention.

FIG. 4 is a graph showing spectral sensitivities of the solid-state imaging device 11 of the present embodiment. The G and B spectral sensitivities are identical with counterpart spectral sensitivities of a related-art color solid-state imaging device shown in FIG. 13. However, the red (R) spectral sensitivity is set so as to become lower in a long wave range.

Specifically, in the solid-state imaging device 11 of the present embodiment, when the spectral sensitivity achieved at a red wavelength of 605 nm (i.e., a peak wavelength of R spectral sensitivity) is taken as 100, the spectral sensitivity achieved at a wavelength of 670 nm becomes 50 or less. A value of 40 or less is preferable, and a value of 30 or less is more preferable. Sensitivity of the solid-state imaging device 11 is very high in a wavelength range of 700 nm or more. This wavelength range is cut by the infrared cut filter 13.

In order to reduce the sensitivity of the solid-state imaging device at a wavelength of 605 nm or more, a coloring material (e.g., pigment or dye) having a high absorption factor at a wavelength of 605 nm or more is mixed in the R filter.

Any spectral characteristic maybe employed as a spectral characteristic of the coloring material which provides absorption around a wavelength of 670 nm, so long as the spectral characteristic satisfies $$ABS\ (670\ nm) > ABS\ (605\ nm)$$

provided that the optical density of a wavelength Xnm is expressed as ABS (X nm). Preferably, provided that ABS (670 nm)/ABS (605 nm)=K, use of the coloring material which achieves K≧5 is desirable. Use of a coloring material which achieves K≧7 is more preferable.

Wherever such a coloring material is provided, setting of the spectral transmittance of the coloring material filter to 80% or more at a wavelength of 605 nm is preferable, and setting of the spectral transmittance of the coloring filter to 90% or more is more preferable. Any spectral characteristic may be adopted in an infrared region (700 nm or more) of the coloring material. When the coloring material is provided on only the path of light entering the R pixels, any spectral characteristic which is equal to or less than 580 nm may be adopted.

Figure 5:
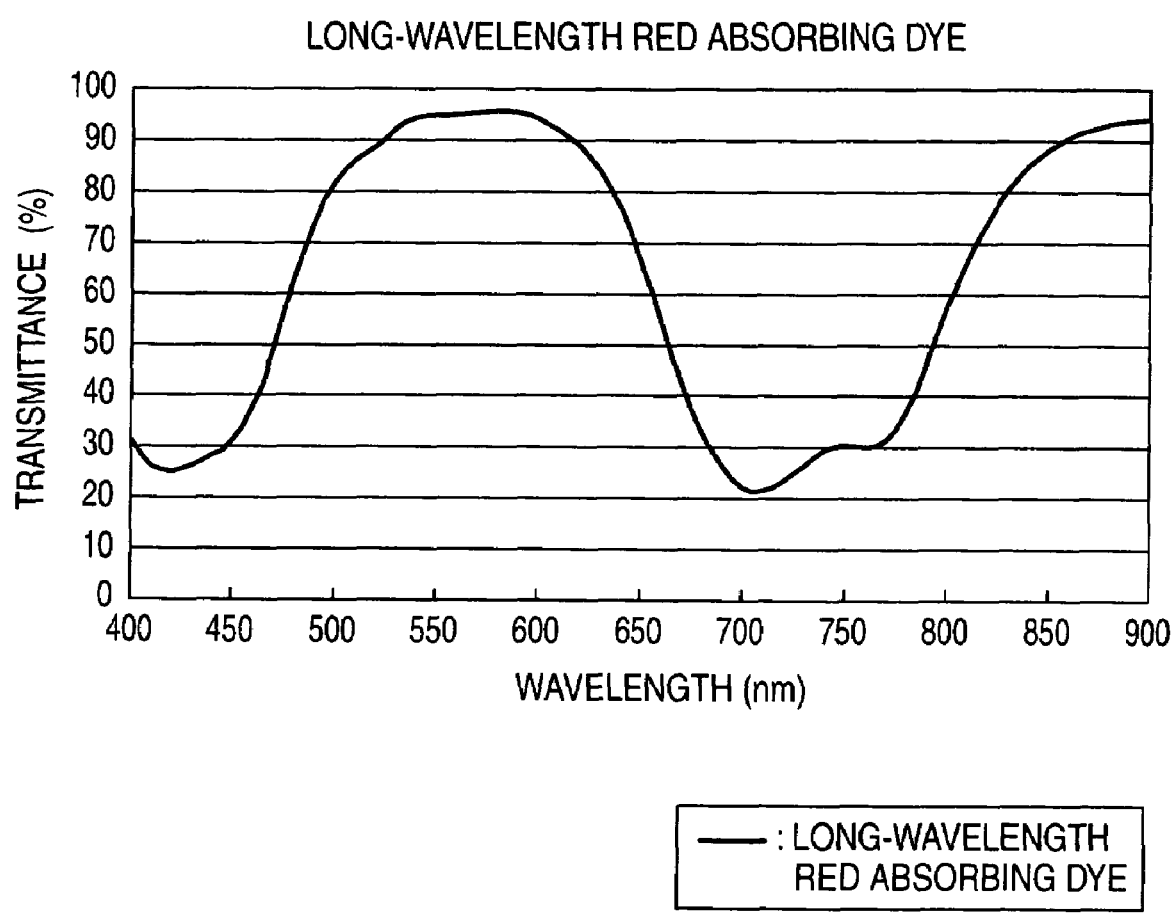
FIG. 5 is a graph illustrating a transmittance of a coloring material mixed in an R filter which embodies the R spectral sensitivity shown in FIG. 4.

Phthalocyanine-based dye, thiatricarbocyanine-based dye, and pentamethyleneoxonol-based dye are mentioned as specific examples of coloring materials. FIG. 5 shows a graph representing an example spectral transmittance of such a coloring material. In the characteristic shown in FIG. 5, the infrared radiation having a wavelength of 700 nm or more cannot be cut by the coloring material filter. However, the infrared radiation is cut by the flat-shaped interference-type infrared cut filter 13, and hence the coloring material filter does not need to cut the infrared radiation.

A ratio of an optical density of the coloring material at 605 nm to an optical density of the coloring material at 670 nm is 12.0, as shown in Table 2.

TABLE 2

Spectral Characteristic of the Dye

|  | 605 nm | 670 nm |
|---|---|---|
| transmittance (%) | 93.1 | 42.6 |
| Optical Density | 0.031 | 0.371 |

Optical Density Ratio = 0.371/0.031 = 12.0

Figure 13:
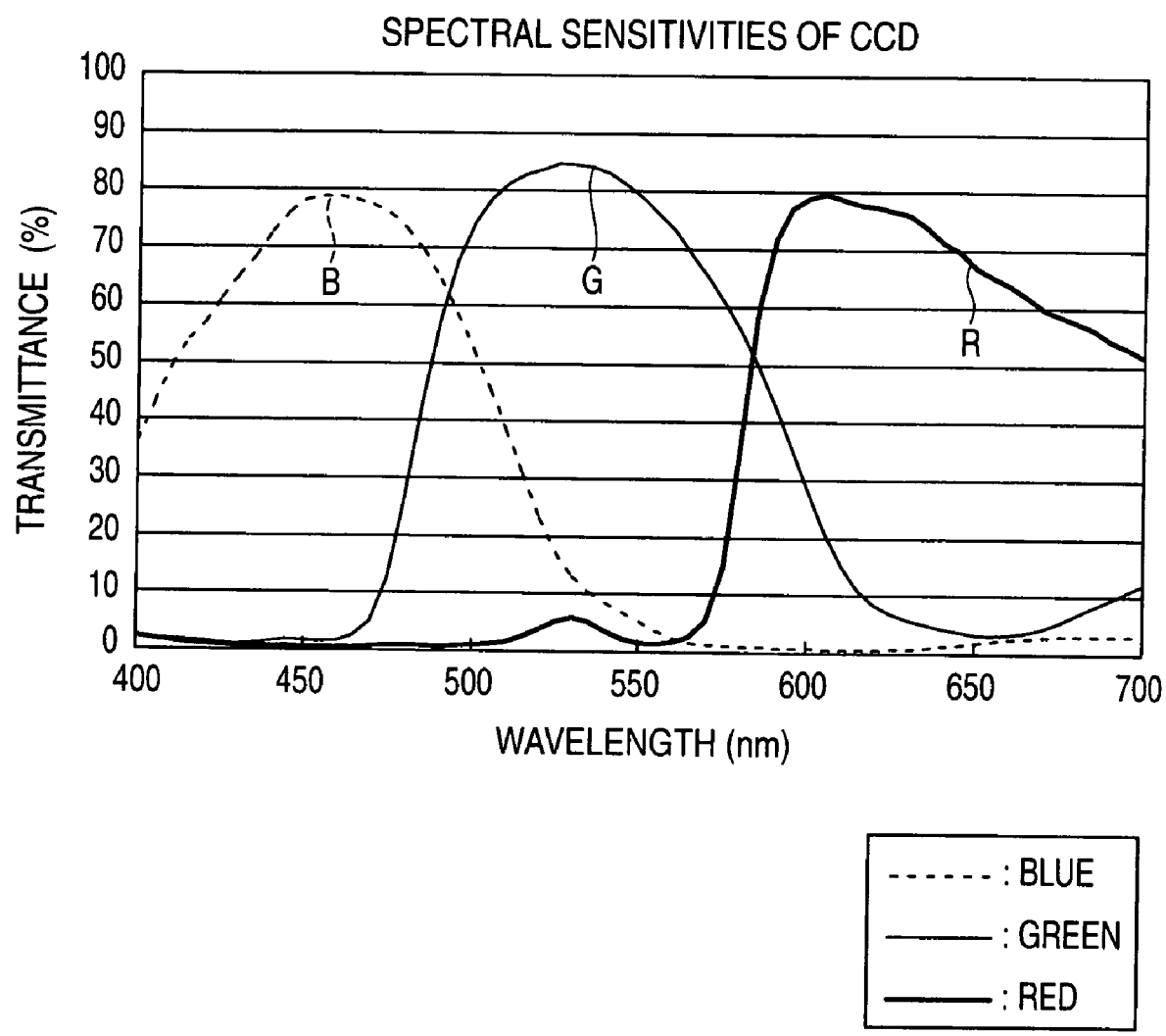
FIG. 13 is a graph showing R, G, and B spectral sensitivities of a related-art solid-state imaging device (a CCD is taken as an example)
Figure 14:
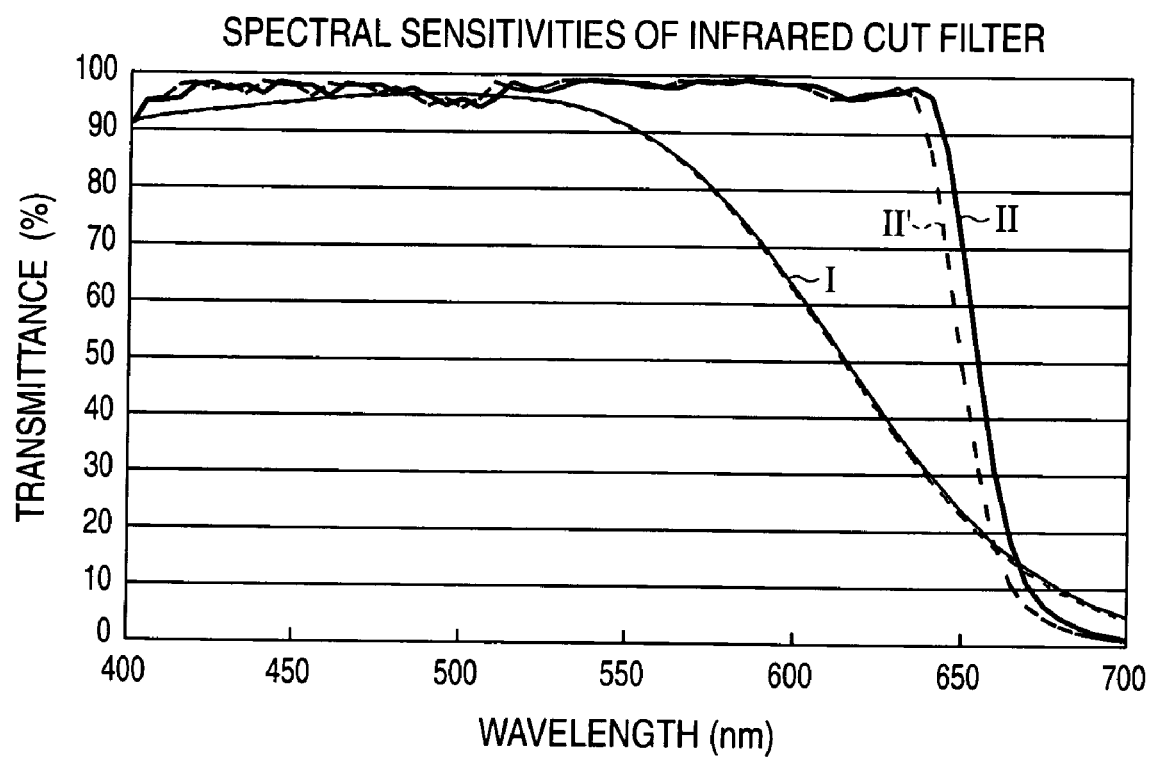
FIG. 14 is a graph showing a characteristic of an infrared cut filter made of color glass and that of an interference-type infrared cut filter.
Figure 15:
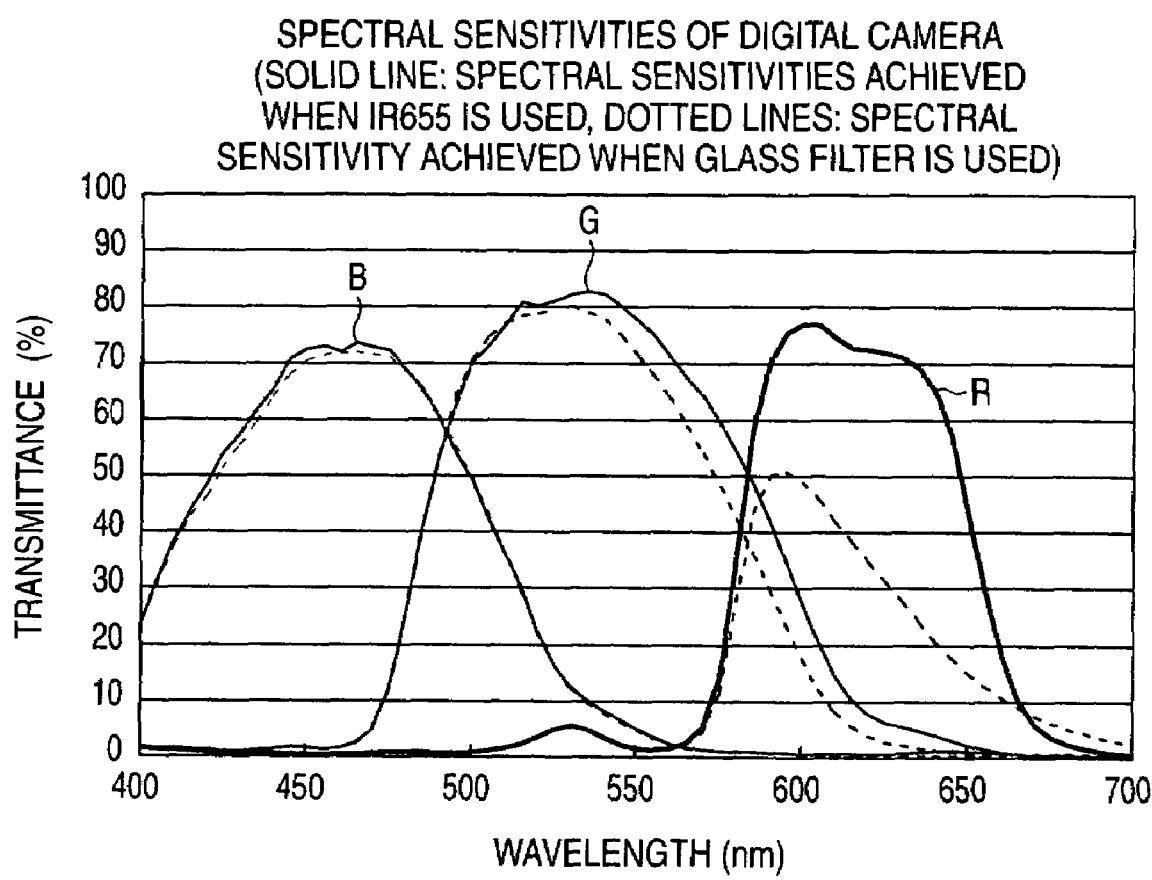
FIG. 15 is a graph showing R, G, and B spectral sensitivities achieved in a digital camera having the interference-type infrared cut filter and the solid-state imaging device in combination.

The coloring material is mixed into the R filter of the solid-state imaging device having the spectral sensitivity shown in FIG. 13, thereby producing the solid-state imaging device 11 having the spectral sensitivity shown in FIG. 4. In the solid-state imaging device having the spectral sensitivity shown in FIG. 4, a ratio of the red (R) spectral sensitivity achieved at 605 nm to the red spectral sensitivity achieved at 670 nm is 0.34, as shown in Table 3. Thus, the sensitivity ratio of the solid-state imaging apparatus can be significantly reduced as compared with the sensitivity ratio of 0.75 of the related-art solid-state imaging device having the spectral sensitivity shown in FIG. 13.

TABLE 3

Rd Spectral Characteristic of CCD

|  | CCD (Comparative Example) shown in FIG. 13 | | CCD (of the present invention) shown in FIG. 4 | |
|---|---|---|---|---|
|  | 605 nm | 670 nm | 605 nm | 670 nm |
| Sensitivity (Relative Value) | 79.5 | 59.7 | 74.0 | 25.4 |
| Sensitivity (670 nm)/Sensitivity (605 nm) | 0.75 | | 0.34 | |

Even when the cut wavelength of the interference infrared cut filter has been shifted toward oblique incident light as a result of a decrease in the sensitivity ratio at a wavelength of 670 nm, the range of variation in the amount of red light entering the R pixels resulting from the shift is suppressed. Consequently, a deficiency in red color at the periphery of the solid-state imaging device 11 is suppressed.

There may be a case where the coloring material cannot be mixed into the R filter 46 because of a physical characteristic or a chemical characteristic of the coloring material. In such a case, the coloring material does not need to be mixed into the R filter. The coloring material may be mixed into the planarized layer 45 or 46 or the microlens 48 shown in FIG. 3. Alternatively, the coloring material may be applied over the surface of the microlens 48, or a solution of this coloring material may be applied to any layer when the planarized layer 46, the color filter 46, the planarized layer 47, and the microlens 48 are stacked one on top of the other, to thus form a film of the coloring material.

The coloring material whose transmittance is shown in FIG. 5 absorbs light having a wavelength of 500 nm or less (i.e., in a blue range) at high ratio. If there is employed a coloring material having a light transmittance of at least 60% at wavelengths within the range of 420 nm to 605 nm, the coloring material can be provided uniformly on the G and B pixel regions as well as on the R pixel regions. Alternatively, the coloring material may be uniformly applied over any surface of the lens 10, the infrared cut filter 13, and the optical low-pass filter 14, all being shown in FIG. 1. As a matter of course, higher transmittance of the blue and green ranges of the coloring material is desirable.

Figure 6:
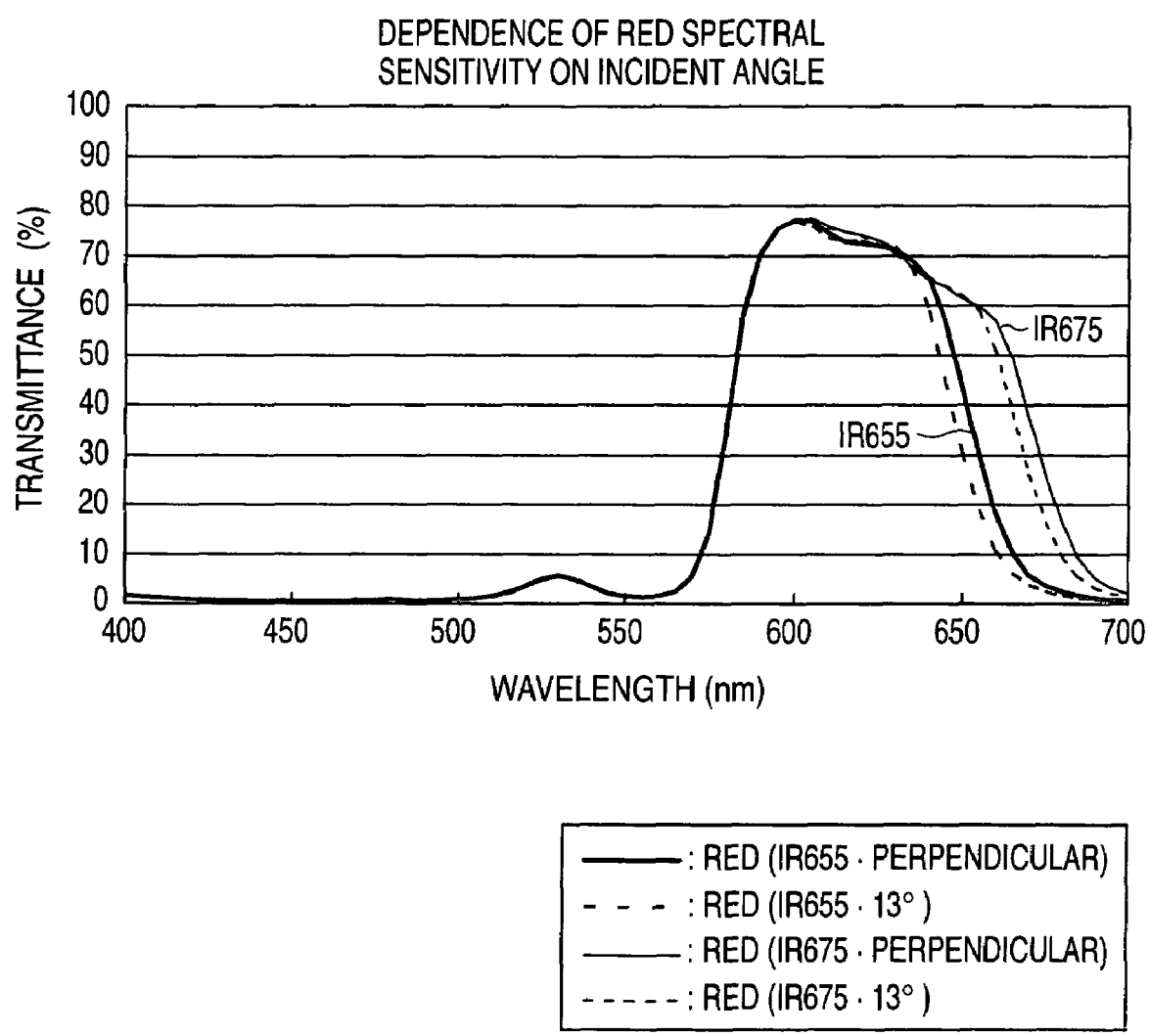
FIG. 6 is a graph showing an angular dependency of R spectral sensitivity on oblique incident light achieved when an interference-type infrared cut filter and the solid-state imaging device are used in combination.

FIG. 6 is a view showing how the red spectral sensitivity in combination with the interference-type infrared cut filter is changed by the incident angle. Namely, an interference-type infrared cut filter IR 655 having a cut wavelength of 655 nm and an interference-type infrared cut filter IR 675 having a cut wavelength of 675 nm are illustrated. Although variations arise in the green (G) spectral sensitivity and the blue (B) spectral sensitivity, the variations are very small, and hence the variations are omitted from the drawing.

Table 4 shows a ratio of an output (i.e., R/G, B/G) from the solid-state imaging device when the incident angle corresponds to perpendicularity and a ratio of an output from the solid-state imaging device when the incident angle is inclined by 13°. The output ratio is computed, provided that a gray subject is photographed under sunlight of 5500K.

TABLE 4

Incident Angle Dependency of Output Ratio of CCD (an output ratio achieved when the incident angle corresponding to perpendicularity is taken as 1.0)

|  | Interference-Type Filter (IR655) | | Interference-type Filter (IR675) | |
|---|---|---|---|---|
|  | R/G | B/G | R/G | B/G |
| Incident Angle = Perpendicularity | 1.000 | 1.000 | 1.000 | 1.000 |
| Incident Angle = 13° | 0.950 | 1.000 | 0.963 | 0.997 |
| Output Ratio Difference (%) | −5.0 | 0.0 | −3.7 | −0.3 |

As can be seen From Table 4, when the incident light is inclined 13°, the red color becomes low sensitivity, whereupon the R/G ratio is decreased. The rate at which the R/G ratio decreases [i.e., an output ratio change rate (%)] assumes −5% in the case of IR655. In the case of IR675, the ratio is understood to be improved by −3.7%.

Figure 7:
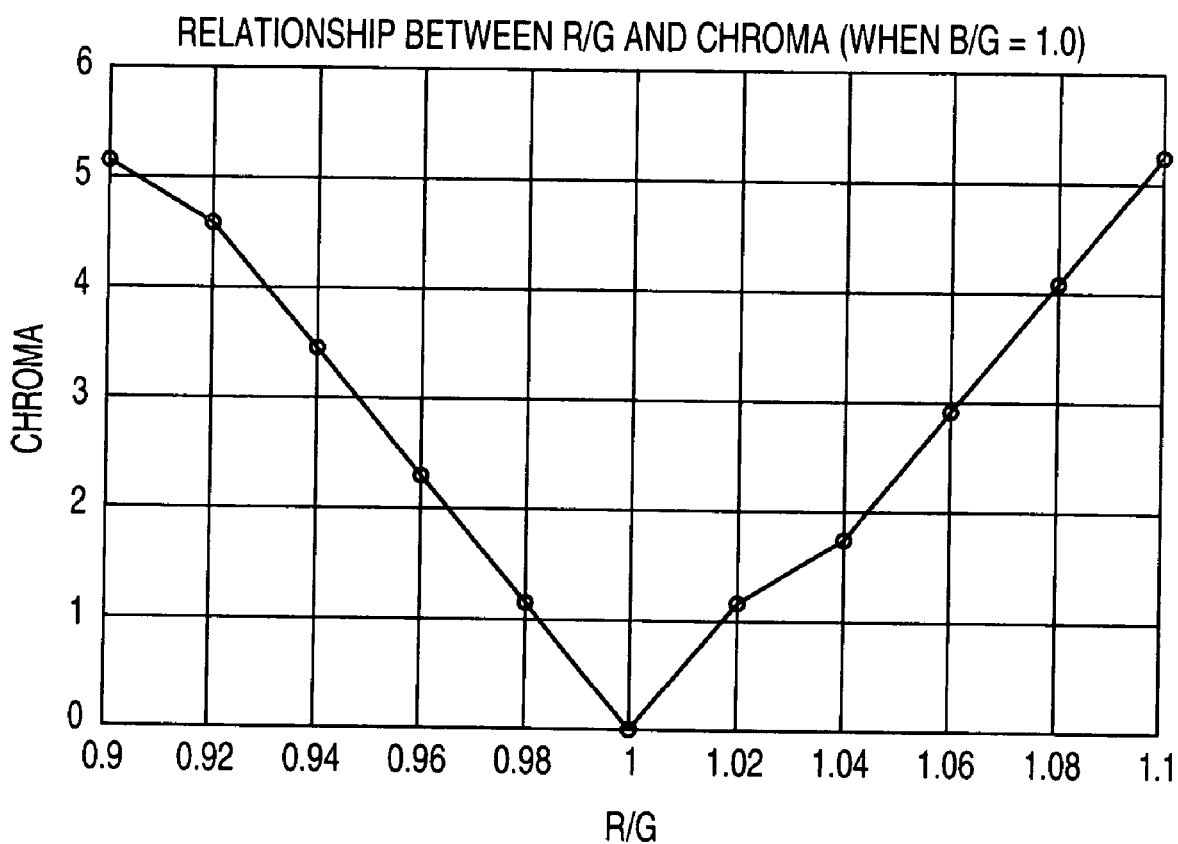
FIG. 7 is a graph showing a relationship between R/G and chroma.

FIG. 7 shows how the chroma of an image obtained by means of photographing gray changes along with variations in R/G ratio. When gray is photographed, R/G=B/G=1 is originally achieved, and chroma originally assumes a value of 0. However, when variations have arisen in R/G ratio, achromatic color assumes a color.

When a color difference (chroma in the case of achromatic color) assumes a value of 1.2 or more, most people conceive the colors as different colors when they are arranged side by side for the purpose of comparison. When they are compared with each other while being separated from each other, the colors can be viewed as an identical color when a color difference assumes a value of 2.5 or less (edited by Japan Color Laboratory, Incorporated foundation; Tips on Color, Vol.2). Accordingly, color shading in a gray screen should most preferably be reduced to chroma of 1.2 or less. A chroma difference between the center and the edge should be reduced to 2.5 or less.

According to FIG. 7, a preferable mode; that is, a chroma of 2.5 or less, is understood to be achieved in a range where R/G assumes a value between −4% and 0%. Most preferably, a chroma of 1.2 or less is understood to be achieved in a range where variations in R/G assume a value between −2% and 0%.

Therefore, when the interference-type infrared cut filter is IR655, variations in R/G assume a value of −5%. When the IR655 is used in combination with the related-art solid-state imaging device having the spectral sensitivity shown in FIG. 13, a deficiency in red color arises. However, in the case of IR675, a value of −3.7% is achieved. Thus, an improvement to a preferred range is understood to have been achieved.

Although not illustrated, a value determined by subjecting the value of IR675 and that of IR655 to proportional distribution is achieved by IR670. Therefore, R/G falls within a range of a value between −4% and 0%. As a result of use of IR670 as an infrared cut filter, human eyes do not perceive a deficiency in red color.

Specifically, a deficiency in color at the periphery of the solid-state imaging device can be improved through use of the infrared cut filter having a cut wavelength of at least 670 nm. A deficiency in red color at the periphery of the solid-state imaging device can also be improved while the red spectral sensitivity of the solid-state imaging device is changed to the characteristic shown in FIG. 4 through use of the coloring material. In the best embodiment, a deficiency in red color can be improved to a much greater extent by employment of the infrared cut filter and the coloring material in combination.

Figure 8:
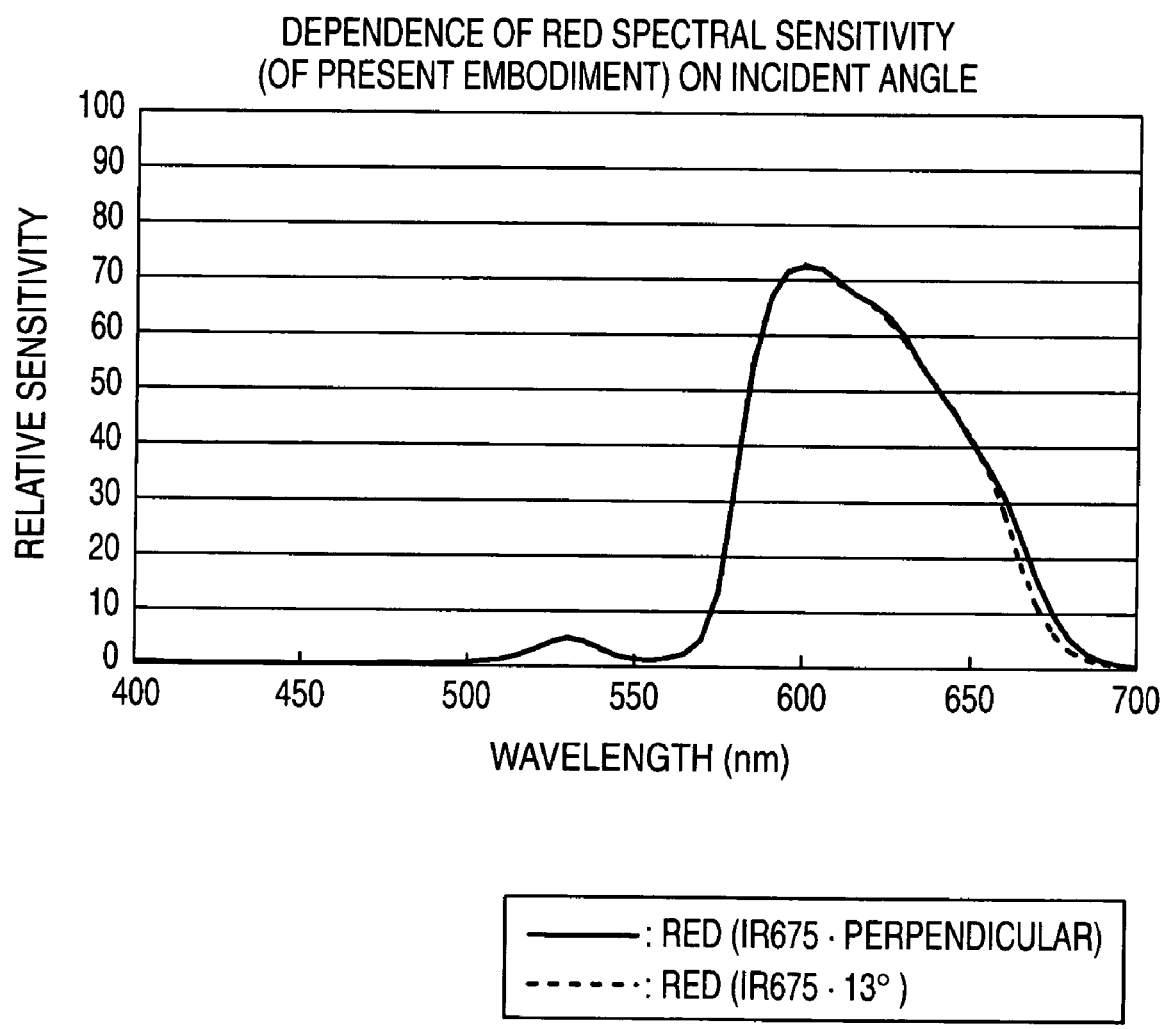
FIG. 8 is a graph showing an incident angle dependency of the R spectral sensitivity achieved when an interference-type infrared cut filter and the solid-state imaging device are used in combination.

FIG. 8 is a graph showing red (R) spectral sensitivity achieved when the digital camera shown in FIG. 1 is assembled by combination of the solid-state imaging device 11 having the spectral sensitivity shown in FIG. 4 with the IR675. A solid line shows a case of incident angle=perpendicularity (i.e., 0°), and dotted lines show a case where the incident angle is inclined by 13°.

Table 5 shows a ratio between outputs from the solid-state imaging device 11 of this digital camera. For comparison, an output ratio achieved when the solid-state imaging device 11 having the spectral sensitivity shown in FIG. 4 is combined with IR655 is also provided side by side.

TABLE 5

Incident Angle Dependency of Output Ratio of CCD (an output ratio achieved when the incident angle corresponds to perpendicularity is taken as 1.0)

|  | Interference-Type Filter (IR655) | | Interference-Filter type (IR675) | |
| --- | --- | --- | --- | --- |
|  | R/G | B/G | R/G | B/G |
| Incident Angle = Perpendicularity | 1.000 | 1.000 | 1.000 | 1.000 |
| Incident Angle = 13° | 0.962 | 1.000 | 0.981 | 0.997 |
| Output Ratio Difference (%) | −3.8 | 0.0 | −1.9 | −0.3 |

When the interference-type infrared cut filter is IR675, variations in R/G assumes a value of −1.9%, which falls within the most preferable range. Even in the case of IR655, variations in R/G assume a value of −3.8%. When compared with a case where a coloring material absorbing long wave red is not provided (see Table 4), an improvement is achieved in this case. Sensitivities achieved when the solid-state imaging device 11 having the spectral sensitivity shown in FIG. 4 is combined with IR675 become as shown in Table 6. Specifically, the red sensitivity assumes a value of 95, and this stands comparison with the case where the related-art solid-state imaging device having the spectral sensitivity shown in FIG. 13 is combined with IR655.

TABLE 6

Comparison of Camera Sensitivities

| CCD/IR CUT FILTER | Red | Green | Blue |
| --- | --- | --- | --- |
| CCD (FIG. 13)/IR655 | 100 | 100 | 100 |
| Present Invention (FIG. 4)/IR675 | 95 | 101 | 101 |

Figure 9:
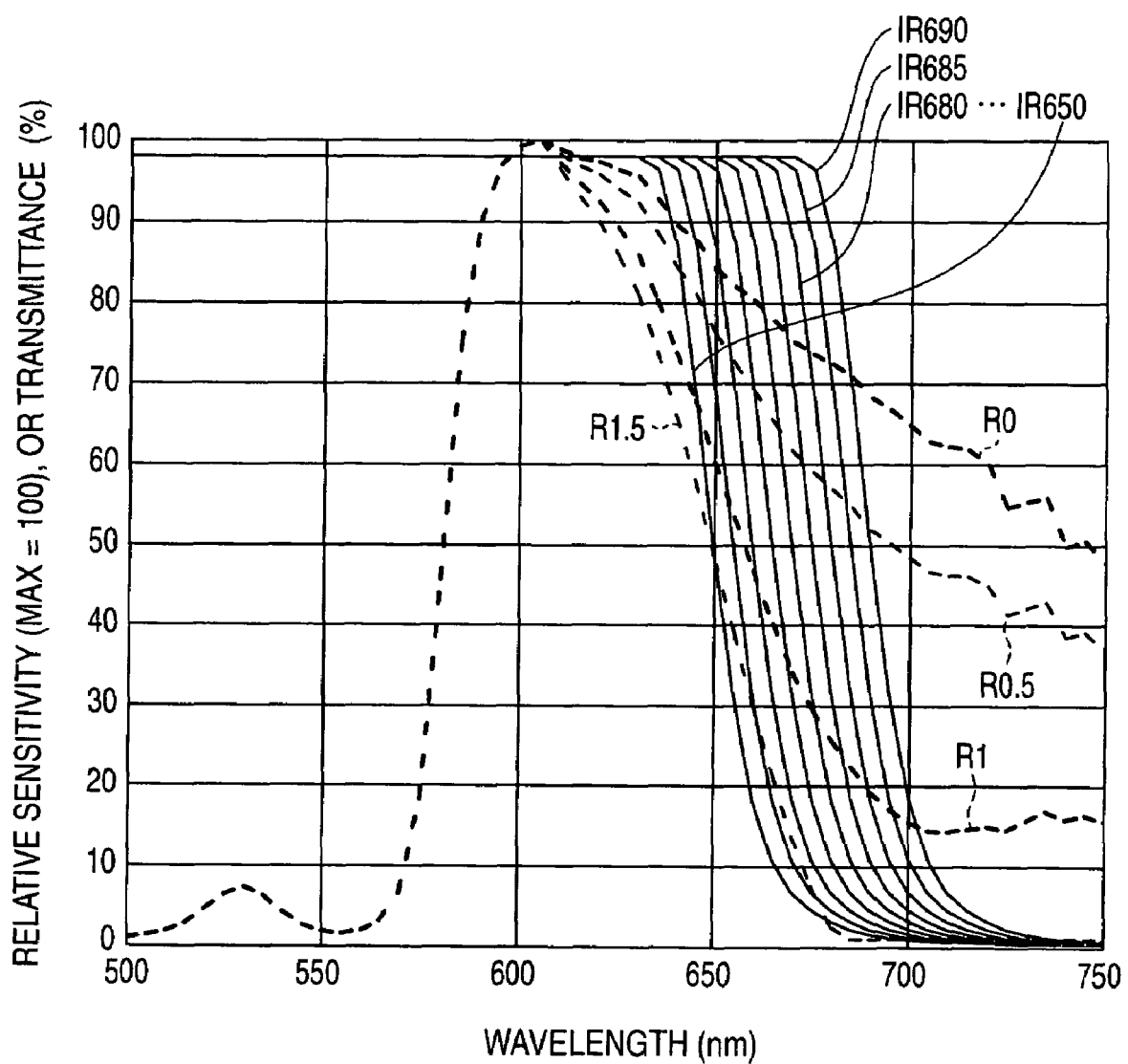
FIG. 9 is a graph showing combinations of four possible R spectral sensitivities and nine possible interference-type infrared cut filters.

FIG. 9 is a view, wherein four possible red (R) spectral sensitivities of the solid-state imaging device 11 (i.e., "R0", "R0.5", "R1" and "R1.5": Here, "R0" depicts the red spectral sensitivity shown in FIG. 13; "R1" depicts the red spectral sensitivity shown in FIG. 4) are prepared; and wherein nine possible infrared cut filters [nine possible cut wavelengths (λ50) in increments of 5 nm from 650 nm to 690 nm] are combined with the red spectral sensitivities. The combinations are taken into the digital camera (equipped with a lens), and a red output from the solid-state imaging device is computed. A rate of change in the red output achieved when the cut wavelength has shifted toward a shorter wavelength by 5 nm is determined.

Figure 10:
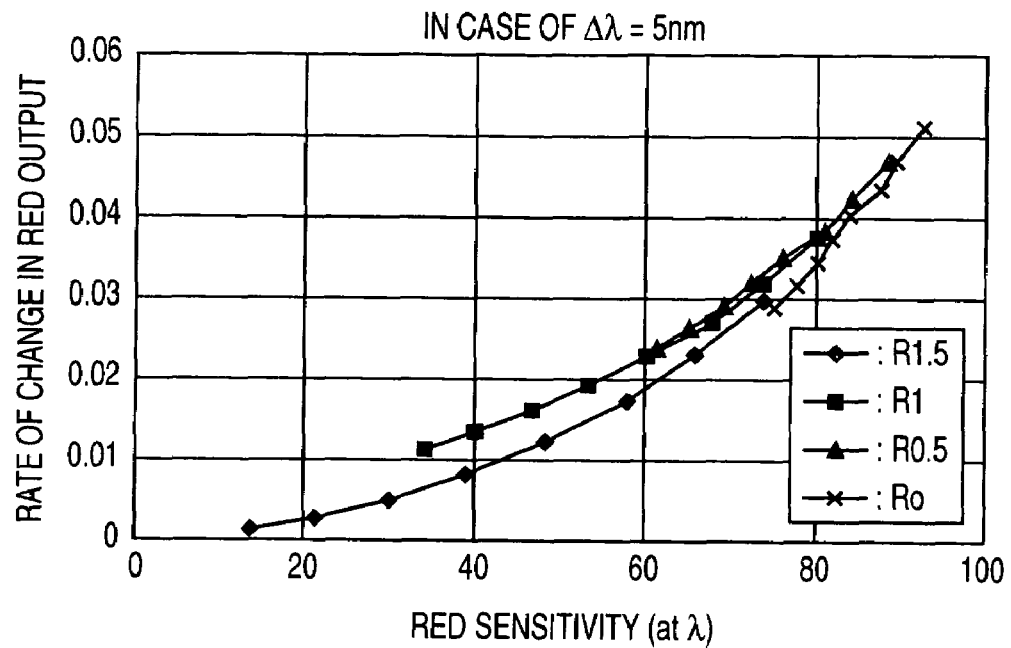
FIG. 10 is a graph showing a correlation between the rate of change in a red output and R spectral sensitivity achieved when a cut wavelength of the interference-type infrared cut filter has been shifted by oblique incident light.
Figure 11:
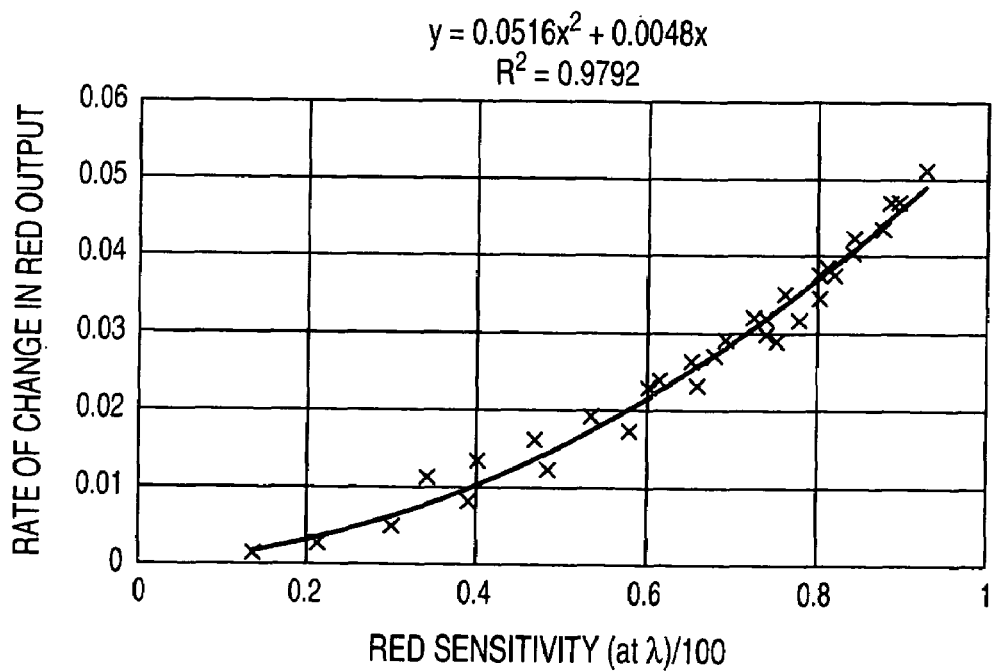
FIG. 11 is a graph showing a correlation curve achieved by the correlation shown in FIG. 10.

FIG. 10 shows a correlation between the rate of change and red spectral sensitivity achieved at λ=cut wavelength −20 nm. The symbol λ depicts a wavelength at which the transmittance of the interference-type infrared cut filter starts to decrease. Substantially the same correlation line is achieved no matter which red spectral sensitivity is taken. FIG. 11 shows the correlation curves.

The correlation is expressed by Equation 1 provided below.

Variations in the area of a red region [Variations in a red output]=a height [Red sensitivity (at λ)]×a width [5 nm]     Eq. 1

Hence, the correlation can be expressed approximately.

From the correlation diagrams shown in FIGS. 10 and 11, a range where variations in a red output <4% or 2% is understood to correspond to red spectral sensitivity (at λ)<80 or 60.

The amount of shift in cut wavelength is uniquely determined by the incident angle. However, in the case of a digital camera which has been miniaturized much, the amount of wavelength shift is at most 13°. Hence, consideration of a shift of up to 5 nm is sufficient. However, provided that the rate of a red output achieved when the incident angle has become much greater is taken as Y, the vertical axis (y) shown in FIGS. 10 and 11 is read as y=Y×(5/Δλ), whereby the correlations shown in FIGS. 10 and 11 are maintained. Δλ denotes the amount of shift in the cut wavelength of the infrared cut filter.

Figure 12:
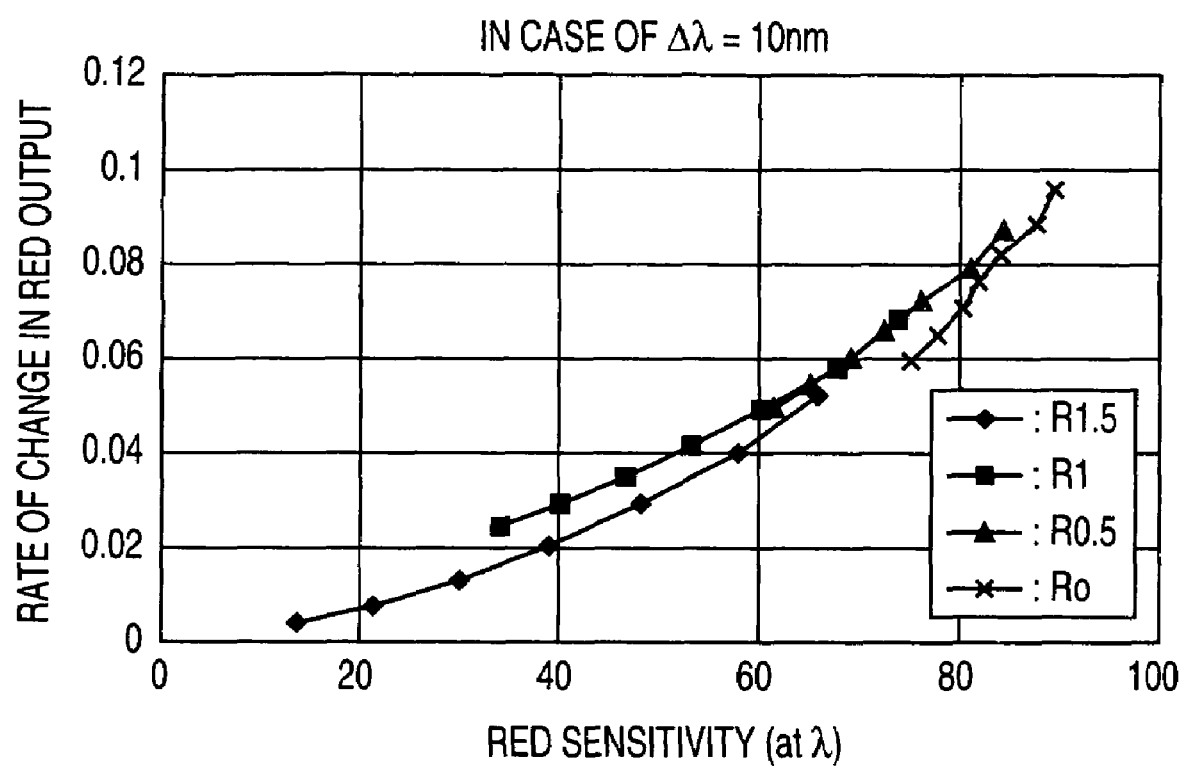
FIG. 12 is a descriptive view of a case where the cut wavelength has shifted 10 nm.

For instance, in the case of a camera which causes a shift of 10 nm, the scales on the vertical axis shown in FIGS. 10 and 11 are read twice the original scale. This is also obvious from Equation 1. Results of actual computation are shown in FIG. 12.

When a shift of 10 nm has arisen, a relationship of variations in red output <4% is achieved within a range in which red spectral sensitivity (at λ)<60. As mentioned above, the preferable range of red spectral sensitivity (at λ) is changed by the amount of shift in cut wavelength.

As has been described, an interference-type infrared cut filter having a cut wavelength of at least 670 nm or more is used as the interference-type infrared cut filter to be used in the digital camera, whereby a deficiency in red color at the periphery of the interference-type infrared cut filter can be improved. However, if the cut wavelength of the interference-type infrared cut filter is too long, the cut wavelength will not be preferable in terms of color reproducibility. Hence, a cut wavelength is preferably 690 nm or less.

When an interference-type infrared cut filter having a cut wavelength of 655 nm is used as an ordinary-employed interference-type infrared cut filter, it is better to place, in an incident light path of the R pixels, a coloring material which absorbs red incident light within a range of shift in cut wavelength such that the amount of change in a signal output from the R pixels of the solid-state imaging device is reduced by means of a shift in the cut wavelength arising when the light entering the interference-type infrared cut filter has become oblique. Preferably, the coloring material is mixed in the R filter, to thereby reduce the red spectral sensitivity at least within the shift range.

Preferably, the digital camera is constituted by means of combining the interference-type infrared cut filter having a cut wavelength of 670 nm to 690 nm with the solid-state imaging device using the coloring material, whereby a much greater improvement can be achieved.

The embodiment has been provided while the CCD in which pixels are arranged in a honeycomb pattern is taken as an example solid-state imaging device. However, needless to say, a CCD of Bayer type may also be employed. Moreover, the present invention can also be applied to a CMOS image sensor as well as to a CCD.

Although the solid-state imaging device using a primary-color-based color filter has been described, the present invention can also be applied to a digital camera in which the solid-state imaging device using a complementary-color-based color filter is combined with the interference-type infrared cut filter.

In this case, the complementary-color-based color filter absorbs only one of R, G, and B colors and permits transmission of tow color signals. Hence, in a digital camera using the complementary-color-based color filter, the coloring material shown in FIG. 5 is insufficient. A coloring material which permits transmission of light of at least a blue range in a short wavelength range; i.e., light of up to 420 nm, must be used.

The above-described interference-type infrared cut filter is based on the premise that the filter is flat. However, the present invention can also be applied to a curved interference-type infrared cut filter. In this case, the curved shape can be made more gentle.

According to this invention, even when a short focus lens is used, a deficiency in red color at the periphery of the color solid-state imaging device becomes much smaller as compared with a deficiency in red color at the center of the same.

By means of a combination of the interference-type infrared cut filter and the solid-state imaging device, both pertaining to the present invention, even when the light entering the interference-type infrared cut filter has become oblique, a deficiency in red color at the periphery of the solid-state imaging device can be eliminated, and hence application of the combination to a digital camera is useful.

The entire disclosure of each and every foreign patent application from which the benefit of foreign priority has been claimed in the present application is incorporated herein by reference, as if fully set forth.

What is claimed is:

1. A color solid-state imaging device used in combination with an interference-type infrared cut filter, coloring material which is contained in or formed on any of layers provided within an incident light path in the color solid-state imaging device or in combination with the interference type-infrared cut filter so that all incident light on the color solid state imaging device passes through the coloring material, wherein the coloring material absorbs the incident light within a wavelength range in which a cut wavelength of the interference-type infrared cut filter shifts toward shorter wavelengths when the incident light obliquely enters the interference-type infrared cut filter so that the shift of the cut wavelength of the of the interference-type infrared cut filter that produces a noticeable deficiency in red coloring at the periphery of the color solid state imaging device is reduced by the coloring material absorption of incident light, and the coloring material has a light transmittance of at least 60 percent at wavelengths within the range of 420 nm to 605 nm.

2. The color solid-state imaging device according to claim 1, further comprising a plurality of effective pixels,
wherein the incident light path comprises a plurality of light paths, each of which corresponding to each of said plurality of effective pixels; and
wherein the coloring material is contained in or formed on any of layers provided within each of said plurality of light paths.

3. The color solid-state imaging device according to claim 1, further comprising at least one of a color filter, a planarizing layer and a microlens, each of which being provided within the incident light path,
wherein the coloring material is contained in at least one of the color filter, the planarizing layer and the microlens.

4. The color solid-state imaging device according to claim 1, wherein a sensitivity of the cut wavelength is made half or less a peak of spectral sensitivity of a red color by the contained coloring material.

5. The color solid-state imaging device according to claim 1, wherein the cut wavelength of the interference-type infrared cut filter ranges from 670 nm to 690 nm.

6. A solid-state imaging apparatus comprising:
an interference-type infrared cut filter; and
a color solid-state imaging device used in combination with the interference-type infrared cut filter,
wherein the interference-type infrared cut filter has a cut wavelength of 670 nm or more and a coloring material is contained in or formed on any of layers provided within an incident light path in the color solid-state imaging device or is formed in combination with the interference type-infrared cut filter so that all incident light on the color solid state imaging device passes trough the coloring material,
wherein the coloring material absorbs the incident light within a wavelength range in which a cut wavelength of the interference-type infrared cut filter shifts toward shorter wavelengths when the incident light obliquely enters the interference-type infrared cut filter so that the shift of the cut wavelength of the of the interference-type infrared cut filter that produces a noticeable deficiency in red coloring at the periphery of the color solid state imaging device is reduced by the coloring material incident light absorption, and the coloring material has a light transmittance of at least 60 percent at wavelengths within the range of 420 nm to 605 nm.

7. The solid-state imaging apparatus according to claim 6, wherein the color solid-state imaging device and the interference-type infrared cut filter are formed integrally.

8. A digital camera comprising:
a photographing lens;
a solid-state imaging apparatus according to claim 6; and
a control section that processes photographed image data output from the solid-state imaging apparatus and stores the photographed image data into a recording medium.

9. A digital camera comprising:

a photographing lens;

an interference-type infrared cut filter that cuts infrared radiation in light entering by way of the photographing lens;

a color solid-state imaging device that converts, into an electric signal, an optical image entering by way of the interference-type infrared cut filter; and a control section that processes a signal output from the color solid-state imaging device and stores image data into a recording medium, wherein a film containing a coloring material is formed on at least one of a surface of the photographing lens, a surface of an optical low-pass filter and a surface of the interference-type infrared cut filter so that all incident light passes there through; and wherein the coloring material absorbs the incident light within a wavelength range in which a cut wavelength of the interference-type infrared cut filter shifts toward shorter wavelengths when the incident light obliquely enters the interference-type infrared cut filter so that the shift of the cut wavelength of the of the interference-type infrared cut filter that produces a noticeable deficiency in red coloring at the periphery of the color solid state imaging device is reduced by the coloring material incident light absorption, and the coloring material has a light transmittance of at least 60 percent at wavelengths within the range of 420 nm to 605 nm.

10. The color solid-state imaging device according to claim 1, wherein the coloring material is phthalocyanine-based dye, thiatricarbocyanine-based dye or pentamethyleneoxonol-based dye.

* * * * *